(12) United States Patent
Mauder et al.

(10) Patent No.: US 7,485,550 B2
(45) Date of Patent: Feb. 3, 2009

(54) METHOD FOR PRODUCING SEMICONDUCTOR ELEMENTS

(75) Inventors: Anton Mauder, Kolbermoor (DE); Hans-Joachim Schulze, Ottobrunn (DE); Franz-Josef Niedernostheide, Münster (DE)

(73) Assignee: Infineon Technologies AG, Munich (DE)

( * ) Notice: Subject to any disclaimer, the term of this patent is extended or adjusted under 35 U.S.C. 154(b) by 329 days.

(21) Appl. No.: 11/166,768

(22) Filed: Jun. 24, 2005

(65) Prior Publication Data

US 2006/0030126 A1    Feb. 9, 2006

(30) Foreign Application Priority Data

Jun. 24, 2004    (DE) .................. 10 2004 030 573

(51) Int. Cl.
*H01L 21/00*    (2006.01)
(52) U.S. Cl. ............................. 438/462; 257/E21.599
(58) Field of Classification Search ................ 438/460, 438/462
See application file for complete search history.

(56) References Cited

U.S. PATENT DOCUMENTS

| 4,325,182 | A |  | 4/1982 | Tefft et al. |
| 6,372,610 | B1 | * | 4/2002 | Chang et al. ................. 438/460 |
| 6,639,280 | B2 | * | 10/2003 | Sugatani et al. .............. 257/347 |

FOREIGN PATENT DOCUMENTS

| DE | 31 31 987 A1 | 4/1982 |
| DE | 102 40 107 A1 | 3/2004 |

* cited by examiner

*Primary Examiner*—David A Zarneke
(74) *Attorney, Agent, or Firm*—Maginot, Moore & Beck

(57) ABSTRACT

A method for producing semiconductor elements comprises forming a hydrogen-correlated doping in a treatment region The treatment region comprises at least part of a region which (i) lies outside an inner contiguous zone containing an integrated semiconductor circuit arrangement but not respective associated separating zones and (ii) lies within an outer contiguous zone containing the respective integrated semiconductor circuit arrangement (10) and also the respective associated separating zones.

20 Claims, 5 Drawing Sheets

METHOD FOR PRODUCING SEMICONDUCTOR ELEMENTS

BACKGROUND

The present invention relates to a method for producing semiconductor elements.

Methods for producing semiconductor elements or chips comprise a series of individual steps. Firstly, in general a semiconductor material region, also referred to as semiconductor wafer, is formed or provided. Said semiconductor material region or semiconductor wafer has a top side region and also a rear side region. One or more regions in which or on which integrated semiconductor circuit arrangements are formed are defined on the semiconductor material region or semiconductor wafer. After the completion of the integrated semiconductor circuit arrangements in the defined regions of the semiconductor material region or the semiconductor wafer, the respective defined regions of the semiconductor material region or semiconductor wafer with the integrated semiconductor circuit arrangement respectively provided and formed there are separated or singulated. These separated defined regions with the respective integrated semiconductor circuit arrangements are then referred to as semiconductor elements or as chips and provided as such. The separation or singulation of the chips or semiconductor elements takes place in the assemblage in the semiconductor material region or semiconductor wafer along separating zones which are provided, located or formed in edge regions of the respective defined regions for the integrated semiconductor circuit arrangements.

What is problematic in the case of conventional methods for producing semiconductor elements is that disturbances, defects or crystal imperfections arise in the underlying semiconductor material region of the integrated semiconductor circuit arrangement, the semiconductor element or the chip as a result of the operation of separating or singulating the semiconductor elements or chips in the region of the separating zones. Although these defects are situated in the edge region of the chip, it is not always possible to avoid interactions with the electrically active region, in particular with specific space charge zones of the semiconductor components forming the integrated semiconductor circuit arrangement. On account of such interactions, it can happen, for example, that specific structural parameters or functional parameters of the chip are altered. Over the operational life of the chip this possibly leads to instabilities or else to failure. By way of example, the occurrence of a rise in the reverse current or in the leakage current of specific components may also be induced on account of the interactions mentioned above.

Accordingly, it would be advantageous to specify a method for producing a semiconductor element in the case of which disturbances, defects or crystal imperfections or the influence thereof on structure and functional parameters in the case of the semiconductor element, during or after the separation or singulation, can be reduced or prevented in a particularly simple yet reliable manner.

SUMMARY

A method for producing semiconductor elements is characterized by the fact that a hydrogen-correlated doping is formed in a and/or in a manner mediated by a treatment region, there being chosen as treatment region or as part thereof a region or a part thereof which lies outside the or a first or inner comprehensive and/or contiguous zone containing the respective integrated semiconductor circuit arrangement but not the respective associated separating zones and which lies within the or a second or outer comprehensive and/or contiguous zone containing the respective integrated semiconductor circuit arrangement and also the respective associated separating zones.

Consequently, a method for producing semiconductor elements includes forming a hydrogen- and/or proton-based doping in a specific treatment region.

A semiconductor element hereinafter may also be understood to mean a semiconductor module or a semiconductor circuit module, in particular in integrated form in each case. Furthermore, a semiconductor element may also be understood to mean an integrated semiconductor circuit or else a discrete semiconductor component, e.g. a transistor, an IGBT or a diode.

A hydrogen-correlated doping may be understood to mean a doping which has been or is induced by hydrogen and/or protons, a doping which is imparted and/or produced by hydrogen defect complexes and/or proton defect complexes, and/or a hydrogen- and/or proton-based doping.

The treatment region is thus e.g. a region at the edge of the integrated semiconductor circuit arrangement or at the edge of the semiconductor element or chip. The treatment region is, in particular, a region which lies outside a zone which contains or comprises the respective integrated semiconductor circuit arrangement and/or which is formed in contiguous fashion. On the other hand, the treatment region is a region which lies within a zone containing the separating zones of the respective integrated semiconductor circuit arrangement. What is involved therefore—e.g. in the case of a rectangular chip—is, in particular, a type of rectangular ring region or frame region around the region of the integrated semiconductor circuit arrangement in which the separating zones are also formed. On account of the hydrogen- and/or proton-based doping provided there, disturbances, defects or crystal imperfections that have possibly formed during singulation or during separation interact with the doping provided there, to be precise in a manner that has the effect of reducing or avoiding the influence of the disturbances, defects or crystal imperfections on the space charge zones and correspondingly on the structural parameters and functional parameters of the integrated semiconductor circuit arrangement.

As an alternative or in addition, the n-type doping induced by the hydrogen treatment or proton treatment may be introduced to such an extent or to a depth in the semiconductor element that the defective zone is no longer affected or influenced during reverse-biased loading. In this case, the doping serves for delimiting the space charge zone within the undisturbed regions of the semiconductor element.

This exploits the fact that hydrogen and/or protons can interact with crystal defects and can form n-doping complexes in this case.

In one preferred embodiment of the method for producing semiconductor elements, it is provided that the hydrogen-correlated doping is formed in such a way that, after the separation or singulation of the respective defined region with the respective integrated semiconductor circuit arrangement, it functions as lateral field stop or as lateral field stop doping of the respectively resulting semiconductor element or chip—in particular in the edge region thereof.

Various procedures are appropriate when carrying out the hydrogen-correlated doping.

Firstly, in accordance with one advantageous embodiment of the method disclosed herein, it may be provided that the hydrogen-correlated doping is effected prior to the separation or singulation of the respective defined region with the respective integrated semiconductor circuit arrangement, the respective semiconductor element or the respective chip.

In addition or as an alternative, it may be provided that the hydrogen-correlated doping is effected after the separation or singulation of the respective defined region with the respective integrated semiconductor circuit arrangement, the respective semiconductor element or the respective chip.

In another embodiment, it is provided that the doping or implantation is performed prior to the singulation, and that a heat treatment is carried out after the singulation.

It may be particularly advantageous if the hydrogen-correlated doping is effected in each case from the side area of the semiconductor element or chip.

In another preferred and alternative or additional embodiment of the invention, it is provided that the hydrogen-correlated doping is effected from the top side region of the semiconductor material region or semiconductor wafer or from a top side region of the respective separated or singulated semiconductor element or chip corresponding to said top side region.

On the other hand, it is conceivable in addition or as an alternative for the hydrogen-correlated doping to be effected from the rear side region of the semiconductor material region or semiconductor wafer or from a rear; side region of the respective separated or singulated semiconductor element or chip corresponding to this surface region.

It is particularly advantageous if the hydrogen-correlated doping is realized by means of a hydrogen plasma treatment.

It may furthermore be provided that during the hydrogen- and/or proton-based doping (DOT) a heat treatment step is carried out, in particular in the temperature range of approximately 300° C. to approximately 500° C. and/or over a time period of approximately 30 minutes to approximately 2 hours.

As an alternative or in addition, it is possible for the hydrogen-correlated doping to be brought about by means of a hydrogen implantation or a proton implantation. The latter may be effected in particular obliquely and also at a shallow angle of incidence or at a steep angle of incidence with respect to the surface.

In another alternative or additional embodiment of the method disclosed herein, it is provided that the angles of incidence are carried out in the presence of an increased oxygen concentration in the material to be doped. This is preferably done by means of an oxygen treatment of the wafer, which, in particular, may be realized by means of a thermal oxidation at an arbitrary earlier point in time in the production process for the integrated semiconductor module.

The hydrogen-correlated doping is particularly effective when it is effected as far as a depth and/or as far as a lateral extent which is/are greater than the depth or position or lateral extent of disturbances, defects, crystal imperfections or instances of crystal damage that have arisen or arise as a result of the separation or singulation in the respective defined or second region in particular with the respective integrated semiconductor circuit arrangement, in the respective semiconductor element or in the respective chip.

Moreover, it is particularly advantageous if the hydrogen-correlated doping is effected as far as a depth and/or as far as a local extent which in each case lies in the range of approximately 2 µm to approximately 200 µm.

Manifold procedures are also appropriate with regard to the separation or singulation method. The separation or singulation of the chips may be effected by means of a sawing process or by laser cutting, to be precise in particular along the separating zones.

It is often not desirable for the hydrogen-correlated doping to be effected on all the zones of the integrated semiconductor circuit arrangement or of the semiconductor material region or semiconductor wafer. In this case, it is particularly advantageous that regions of the semiconductor material region or semiconductor wafer or regions of the integrated semiconductor circuit arrangement in the case of which the hydrogen-correlated doping is not to be effected are masked beforehand.

In this case, it is appropriate for a nitride layer, a plasma nitride layer and/or a metallization to be chosen and/or formed as masking.

It is further advantageous if in connection with the formation of the hydrogen-correlated doping, in the treatment region, defects and/or crystal imperfections are produced in a targeted manner, in particular by means of ion irradiation, electron irradiation and/or by irradiation with laser radiation.

In another embodiment of the method disclosed herein, it is provided that in connection with the formation of the hydrogen-correlated doping, a plurality of doping steps or implantations are carried out, in particular with different energies.

A further aspect of the method disclose also consists in using the procedure with regard to the hydrogen-correlated doping quite generally in the context of a method for modifying an, in particular lateral, field stop layer.

A semiconductor element or a chip may be formed by means of the method disclosed herein for producing semiconductor elements.

These and further aspects of embodiments of the present invention are explained in detail below using different words:

In the case of high-voltage and especially in the case of field stop components, the space charge zone, in the case of reverse-biasing, reaches below the planar edge termination further in the direction of the outer chip edge and directly at the surface, where it is limited in its extent by the channel stopper. The lower the doping of the basic material, the more pronounced this effect is. During the singulation of the chips by means of e.g. lasers or separation using a saw, crystal imperfections inevitably occur at the separating area, which crystal imperfections may reach laterally deep into the chip. In addition, so-called chipping may occur—particularly in the case of sawing—in the silicon. This occurs preferably near or at the front and rear side of the chip.

If the space charge zone, in the case of reverse-biasing, then impinges on such damaged zones and crystal imperfections, at least the reverse current of the chip rises. Said reverse current is usually unstable over the operational life (e.g. because the crystal imperfections migrate as a result of temperature and load changes) and may also lead to the failure of the component.

Structures (e.g. oxide webs) that are intended to prevent the chipping and the crystal imperfections from propagating right into the active region of the semiconductor are situated laterally with respect to the sawing track on the front side. This is also sufficient in the case of components based on epitaxial basic material. Chipping on the rear side does not have an adverse effect here because the carrier substrate serves only for mechanical stabilization and for ohmic connection of the rear side contact.

In the case of high-voltage components, which, starting from a reverse voltage of approximately 600 V, are increasingly based on homogeneously doped float zone substrate wafers, the space charge zone, in the case of reverse-biasing, extends very far up to the rear side surface of the semiconductor. Thus, chipping on the rear side represents a serious problem here, especially if the basic material doping is lowered through the use of field stop technologies and the space charge zone thus reaches laterally further in the depth in the direction of chip edge or sawing track.

The edge termination therefore has to be chosen to be wide enough in order that the space charge zone reliably ends before the sawing track and the defect-rich zone preceding it (with or without additional chipping).

This is undesirable since the additional inactive chip area required increases the costs.

As an alternative, the doping could be increased in the direction of the sawing edge in order practically to obtain a lateral field stop. Isolation diffusions have been used hitherto for this purpose. However, owing to the high temperature budget needed for producing them, these constitute severe restrictions in the overall process and are expensive, moreover.

Purely implanting donors into the sawn sidewall of the component requires at least one high-temperature step for annealing, which, at such a late point in time in the process, is irreconcilable with the permissible temperatures of the metallizations, all the more so if this doping is intended to be driven into the chip even further than the instances of crystal damage caused by the singulation.

The disclosure herein presents a method which makes it possible to provide a lateral field stop after the singulation. One particular advantage is that it can be applied to an arbitrary component without influencing its active structure and the other edge termination on the surface or the passivation.

Prior to the singulation, a masking that prevents the indiffusion of hydrogen may be applied as required on the finished wafer provided with front and rear side metal and also with the passivation. The chips are subsequently singulated on the wafer e.g. using a saw or a laser. The lateral field stop is then produced by means of a hydrogen doping from the sawing track. A hydrogen plasma treatment is suitable for this purpose. The instances of crystal damage that arose as a result of the sawing support the hydrogen-induced donor formation, which takes place only at a sufficiently high defect and hydrogen concentration.

The hydrogen that has indiffused during the plasma treatment may, as required, be indiffused even further by means of an additional heat treatment step, in particular in the lateral direction. Said heat treatment step may be conducted in the temperature range of approximately 300° C. to approximately 500° C. and, in particular, over a time period of approximately 30 minutes to approximately 2 hours.

Furthermore, a high oxygen concentration is beneficial in particular in the region near the surface, since, apart from the hydrogen-induced donors, oxygen-correlated thermal donors also arise, which can be utilized for realizing the lateral field stop.

As an alternative or in addition, it is possible to use a proton implantation in the case of which the protons are radiated in at a shallow angle or at a steep angle with respect to the surface. Additional radiation-induced defects arise in this case and, in combination with hydrogen, serve for donor formation. In this case, the hydrogen-induced doping is intended more advantageously to reach further into the chip than the instances of crystal damage that arose as a result of the singulation. Typical penetration depths are of the order of magnitude of a few μm to 200 μm.

The process steps required for the hydrogen-correlated or -induced doping range through temperatures of between 220° C. and less than 500° C. and are thus compatible with metallizations and passivations.

In this connection, it is also conceivable to implant hydrogen atoms in masked fashion from the wafer front side and/or wafer rear side and to indiffuse them in a subsequent heat treatment step in the vertical direction in order to produce, in the edge region, an n-doped layer which is continuous in the vertical direction and prevents the space charge zone from adjoining the region damaged by the sawing process.

Since the irradiation-dictated defects substantially contribute to the desired donor formation, the irradiation depth, i.e. the depth of the so-called "end-of-range", should correspond in particular approximately to the wafer thickness of the wafer or the thickness of the electrically active layer in the case of a deeply diffused wafer or epitaxial wafer, so that, during a subsequent heat treatment step, the implanted hydrogen can diffuse into the irradiated region and can form donors in a sufficient manner there as far as possible over the entire irradiation depth. It is also conceivable for this purpose to carry out a plurality of hydrogen implantations with different energies.

This hydrogen implantation should preferably be effected prior to the sawing process, and therefore also be dimensioned sufficiently in terms of width and doping concentration. The separation of the chips should then be effected as far as possible in the center of this n-doped zone.

A plasma nitride layer, which can be deposited at temperatures of significantly less than 500° C., may be used for masking during the hydrogen plasma treatment. The proton implantation can e.g. also be masked by a sufficiently thick metal layer.

The method described herein provides, inter alia, methods for producing a lateral field stop in components for the purpose of preventing increased leakage currents on account of instances of crystal damage that have arisen during the singulation.

These and further embodiments of the present invention will be explained in more detail below with reference to the accompanying drawings.

BRIEF DESCRIPTION OF THE DRAWINGS

FIGS. 1, 1A are a schematic plan view of a semiconductor material region that can be used in the context of one embodiment of the method according to the invention, and respectively a lateral cross-sectional view.

The same reference symbols are used below for structurally or functionally similar or comparable elements or structures without a detailed description of the corresponding structural elements being repeated upon every occurrence of said reference symbols.

DESCRIPTION

Figure 1:
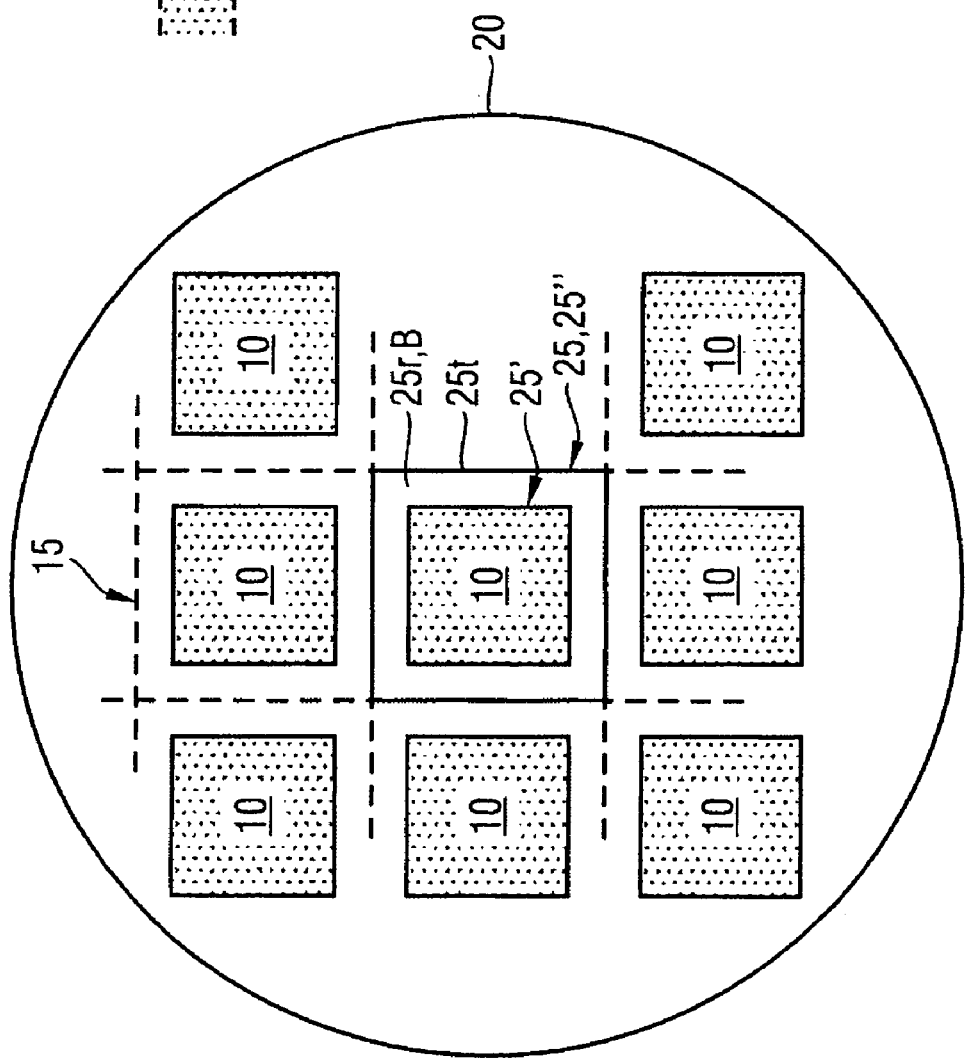

FIG. 1 shows a wafer-type semiconductor material region 20 formed in circular fashion, which is also referred to as semiconductor wafer 20. Corresponding predefined regions 25, before a process start, are defined on the surface region 20a or top side region 20a of the semiconductor wafer 20, corresponding semiconductor circuit arrangements 10 being formed in said predefined regions in the context of the method according to the invention, the defined regions 25 in each case also having an edge region 25r which, after a separation or singulation operation, serves as chip edge 25r of the then detached or singulated semiconductor elements 15 or chips 15.

The electrically active edge termination of the semiconductor element 15 or of the chip 15 is also formed on the top side of the edge region 25r.

A so-called separating zone 25t, which serves for separation or singulation, is formed in each case on the outermost edge of the edge region 25r. An inner region 25', comprising the actual integrated semiconductor circuit arrangement 10, is then formed within the edge region 25r. The edge region 25r also simultaneously defines that region B which is then provided, with the hydrogen- or proton-based doping DOT. This region is therefore also called treatment region B and lies inside the outer region 25" having the separating zones 25t.

FIG. 1A shows a lateral cross-sectional view of the illustration from FIG. 1, the top side 20a and the rear side 20b of the semiconductor wafer 20 likewise being illustrated here.

Figure 2:
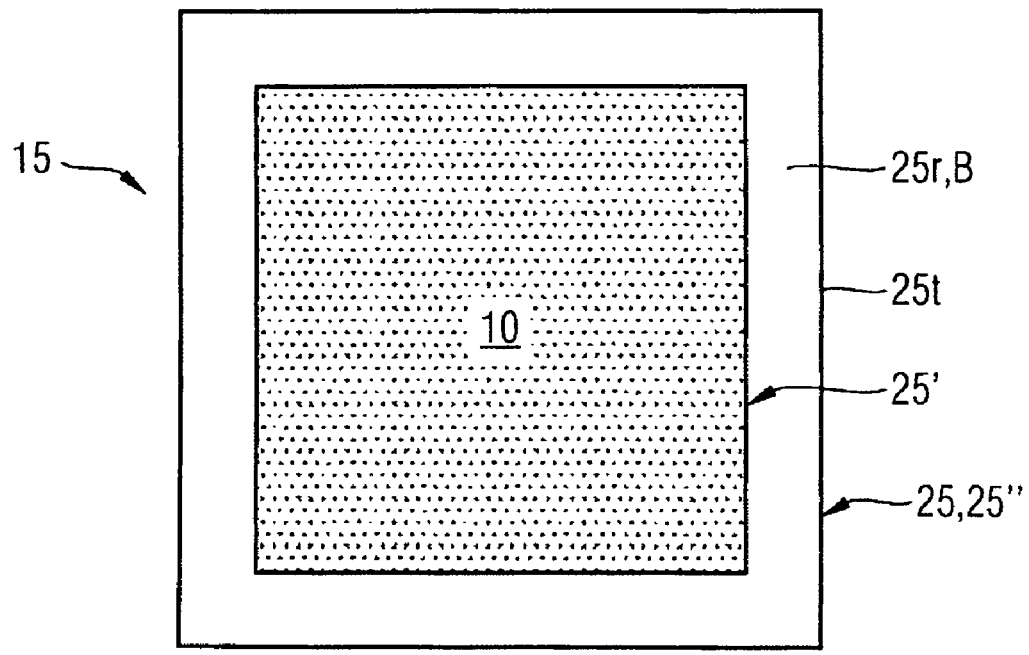
FIGS. 2, 2A are a schematic plan view of an integrated semiconductor element or chip as the result of a preferred embodiment of the method according to the invention, and respectively a lateral cross-sectional view.

FIG. 2 shows the region 25 with integrated semiconductor circuit arrangement 10 after the separation or singulation from the semiconductor wafer 20. The thus separated or singulated region 25 with integrated semiconductor circuit arrangement 10 consequently forms a semiconductor element 15 or a chip 15 and also has, in addition to the elements already explained in connection with FIGS. 1 and 1A, a corresponding surface region or top side region 15a and a corresponding rear side region 15b.

Figure 2A:
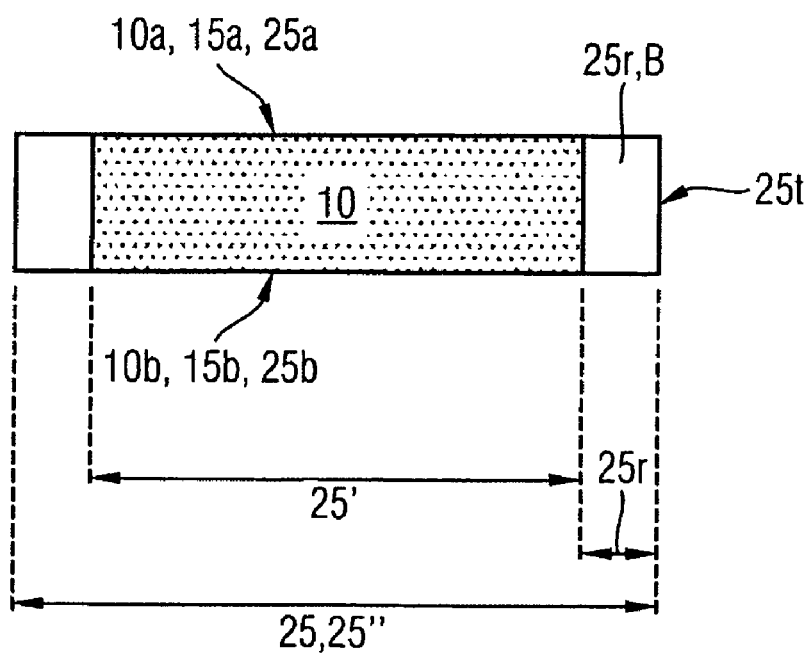

In all of the configurations of FIGS. 1 to 2A, the doping to be provided according to the invention takes place via the treatment regions B, to be precise either via a top side 20a, 15a or a rear side 20b, 15b or via both regions.

The treatment region B in general does not pass completely over the provided active edge termination A from the edge or from the sawing track 25t. It may be embodied such that it already ends within the transition region Ü present, in which case, however, it must be ensured that said treatment region reaches at least as deep as the defects established during the singulation.

FIGS. 1 to 2A illustrate the geometrical conditions with regard to the separating zones 25t one-dimensionally. The further FIGS. 3A and 3B illustrate them more realistically in two-dimensionally extending fashion.

Figure 3A:
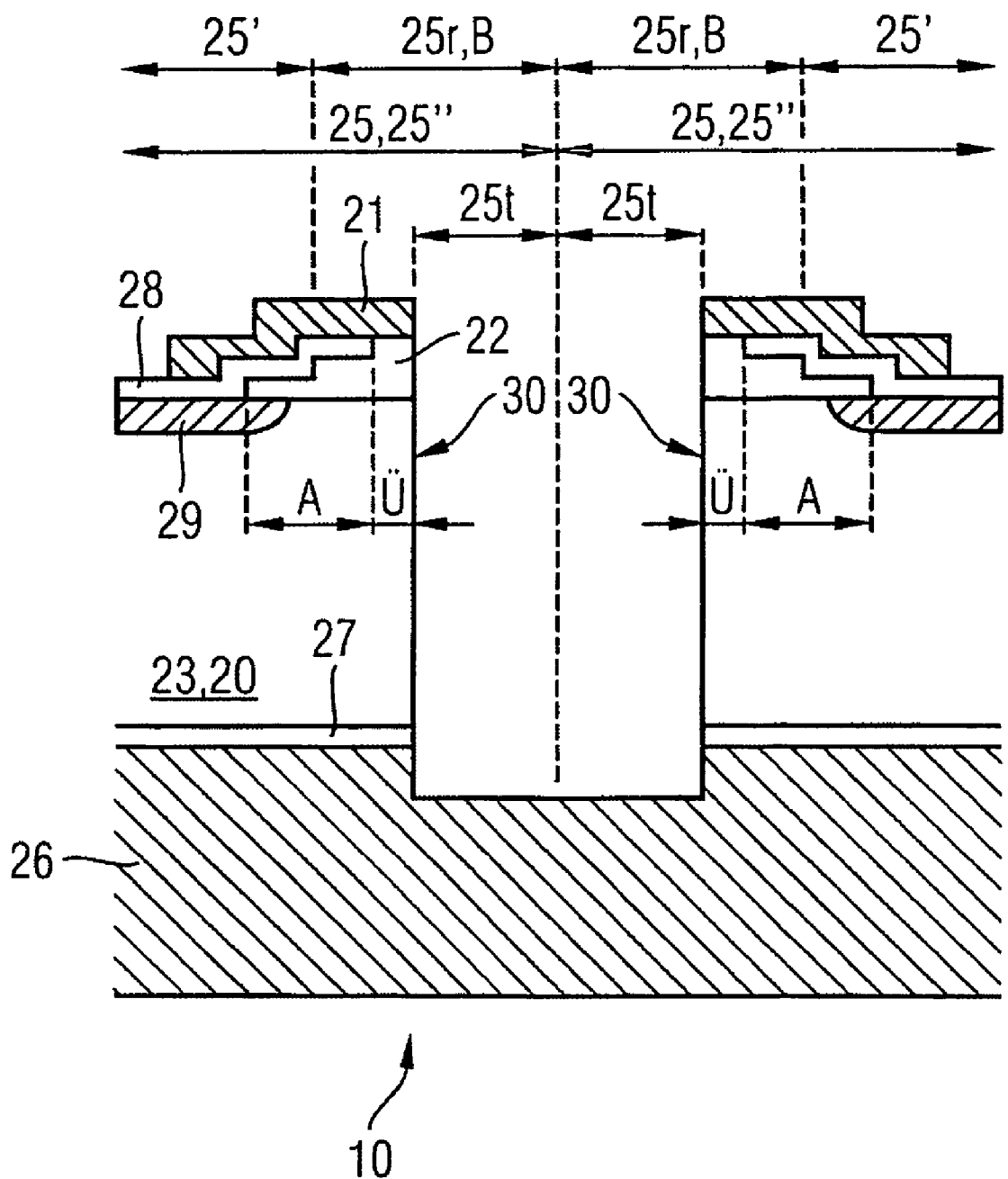
FIGS. 3A, B are lateral cross-sectional views of a region of a semiconductor element produced according to the invention before and after the doping to be provided according to the invention.
Figure 3B:
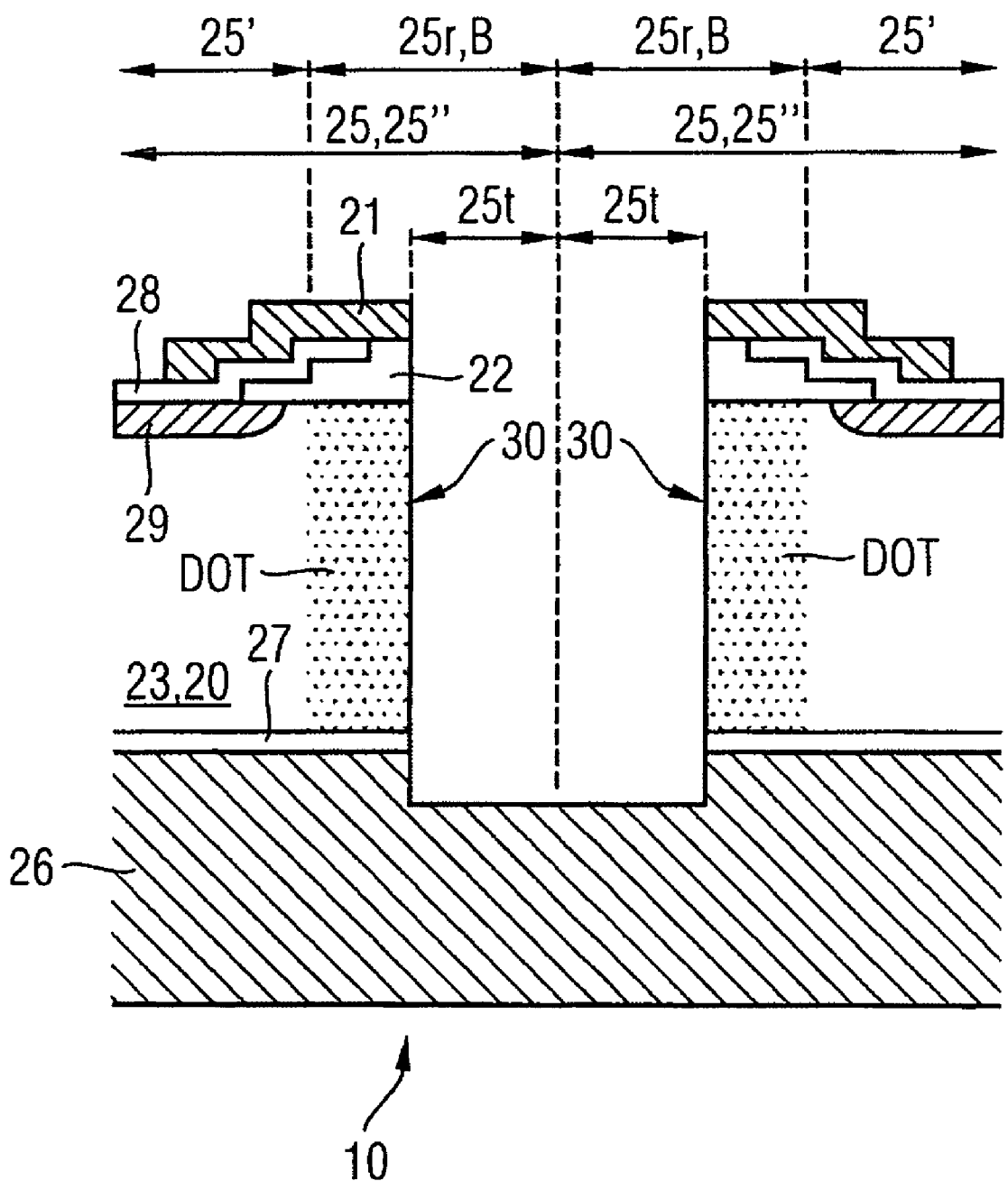

FIGS. 3A and 3B show, in lateral cross-sectional view, a detail from a semiconductor wafer 20 with two integrated semiconductor circuit arrangements 10 formed there and the corresponding region 25, which receive or have in the semiconductor wafer 20 of said integrated semiconductor circuit arrangements 10.

In particular, a corresponding separating zone 25t is illustrated in the form of a sawing track. In the transition from the state of FIG. 3A to the state of FIG. 3B, the doping DOT to be provided according to the invention was introduced into the treatment region B formed, this time in particular via the side area 30 of the sawing track or separating zone 25t, so that a proton- and/or hydrogen-based doping indicated by hatching is in each case formed in particular in the edge region 25r.

At curvatures of the doping zones 29 of the active region, electric field spikes occur in reverse-biased operation and drastically reduce the blocking capability in comparison with the blocking capability of a planar pn junction. In order to attain the blocking capability of a planar pn junction as closely as possible, structures, e.g. on the basis of field rings, laterally varying doping (VLD) or the like are provided, which are usually additionally provided with a passivation 21 in order to prevent electrical flashovers from the metallization of the active zone into the edge.

FIGS. 3A and 3B schematically illustrate a field plate edge termination as an example of an electrically effective or active edge termination for the electrically active zone 29, in the case of which field plate edge termination an electrically conductive layer as field plate 28 is spaced apart from the semiconductor substrate 23 by means of insulation layers 22, e.g. made of oxide.

However, the invention is not restricted to this edge termination shown, but rather can be combined with any arbitrary edge termination.

Figure 4:
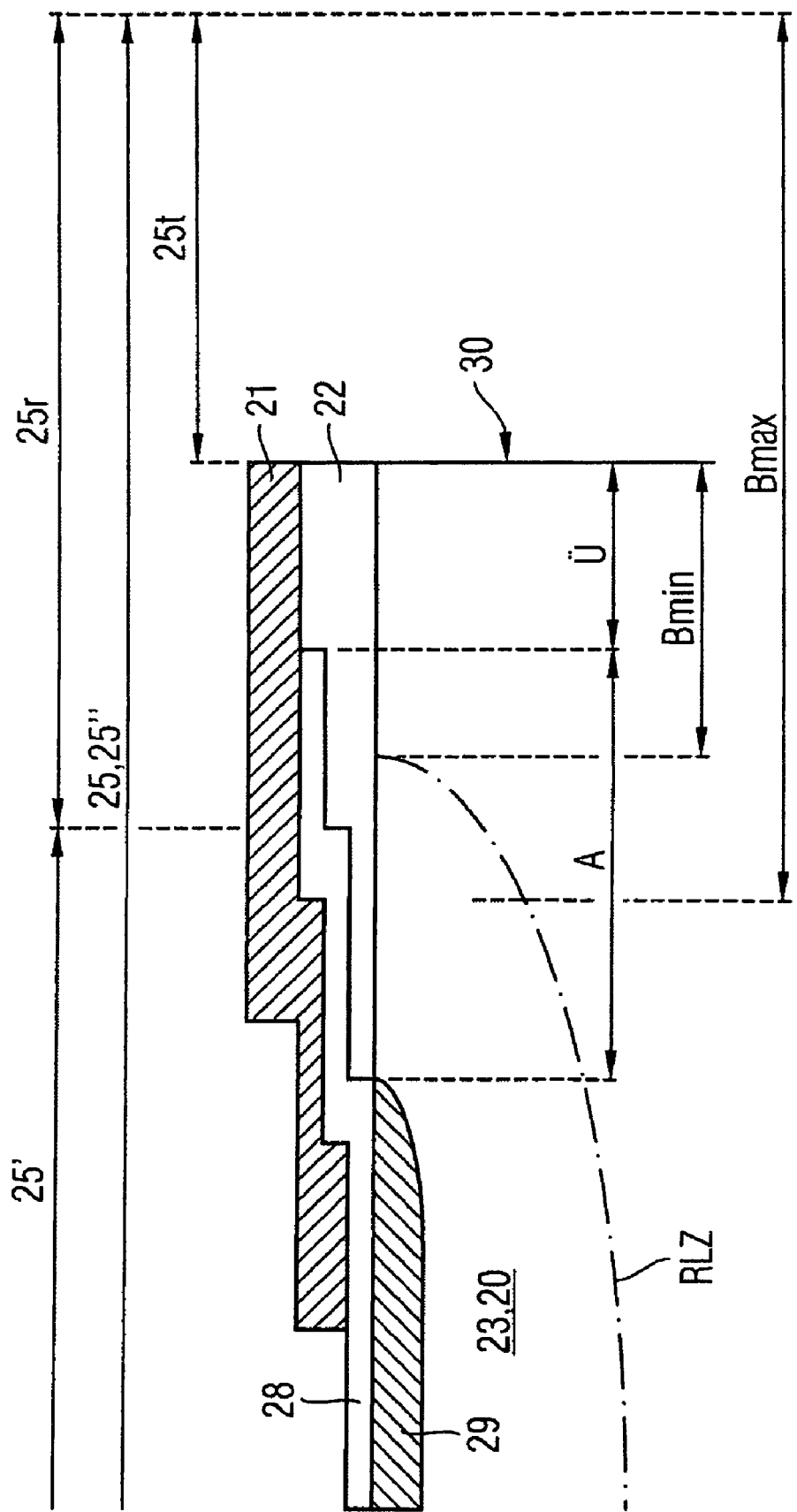
FIG. 4 is a schematic and sectional side view of one embodiment of a region of a semiconductor element produced according to the invention for elucidating the definition of the treatment region.

FIG. 4 is a schematic and sectional side view of one embodiment of a region of a semiconductor element 15 produced according to the invention for elucidating the definition of the treatment region B.

The actual semiconductor circuit arrangement 10 with the semiconductor element 15 according to the invention in this case has an electrically active edge termination region A, which delimits the space charge zone RLZ laterally toward the edge 25r. According to the invention, the treatment region B must lie between a maximum region Bmax and a minimum region Bmin. The maximum region Bmax extends from the last or laterally outermost electrically active zone of the edge termination A as far as the laterally outermost region of the separating zone 25t or sawing track 25t. The minimum region Bmin extends from the side area 30 as laterally outermost position as far as a location in the semiconductor material region 20 at which defects from the singulation (sawing defects) are still present or will be present.

The treatment region B actually chosen thus always comprises the minimum region Bmin and lies within the maximum region Bmax.

The invention claimed is:

1. A method for producing semiconductor elements, the method comprising:
   providing a semiconductor material region having a top side region and having a rear side region;
   forming at least one semiconductor circuit arrangement in each of a plurality of defined regions of the semiconductor material region, each of the defined regions including an inner zone containing the semiconductor circuit arrangement, an outer zone including edge regions, and separating zones located in the edge regions;
   separating the plurality of defined regions of the semiconductor material region along the separating zones and into semiconductor elements;
   forming a lateral field stop or a lateral field stop doping for each of the semiconductor elements; and
   effecting hydrogen-correlated doping in at least one treatment region in each of the plurality of defined regions, wherein the at least one treatment region in each defined region (i) lies outside the inner zone, and (ii) lies within the outer zone and also within the separating zones; and
   wherein the hydrogen-correlated doping is effected in such a way and the plurality of defined regions are separated in such a way that the hydrogen-correlated doping partially or completely remains after the separation of the plurality of defined region and functions as a lateral field stop or as a lateral field stop doping of the semiconductor elements.

2. The method of claim 1 wherein the hydrogen-correlated doping is effected prior to the separation of the plurality of defined regions.

3. The method of claim 1 wherein the hydrogen-correlated doping is effected after the separation of the plurality of defined regions.

4. The method of claim 3 wherein the hydrogen-correlated doping is effected from a side area of each of the separated semiconductor elements.

5. The method of claim 1 wherein the hydrogen-correlated doping is effected from the top side region of the semiconductor material region or from a top side region of each of the separated semiconductor elements.

6. The method of claim 1 wherein the hydrogen-correlated doping is effected from the rear side region of the semiconductor material region or from a rear side region of each of the separated semiconductor elements.

7. The method of claim 1 wherein the hydrogen-correlated doping is brought about by a hydrogen plasma treatment.

8. The method of claim 1 wherein during the hydrogen-correlated doping a heat treatment step is conducted in the temperature range of approximately 300° C. to approximately 500° C. over a time period of approximately 30 minutes to approximately 2 hours.

9. The method of claim 1 wherein the hydrogen-correlated doping is carried out in the presence of an increased oxygen concentration in a material to be doped, wherein a thermal oxidation is carried out in a preliminary process in the material.

10. The method of claim 1 wherein the hydrogen-correlated doping is effected in each of the plurality of defined regions as far as a first position which is greater than a second position of disturbances, defects, crystal imperfections or instances of crystal damage resulting from the separation in each of the defined regions.

11. The method as claimed claim 1 wherein the hydrogen-correlated doping is effected in each of the plurality of defined regions (i) as far as a depth that corresponds to the active thickness of the semiconductor element and (ii) as far as a lateral extent in the range of approximately 2 µm to approximately 200 µm.

12. The method of claim 1 wherein the separation of the plurality of defined regions is effected by a sawing process along the separating zones.

13. The method of claim 1 wherein regions of the semiconductor material region in which the hydrogen-correlated doping is not to be effected are masked beforehand.

14. The method of claim 13 wherein a nitride layer, a plasma nitride layer or a metallization is used as masking.

15. The method of claim 1 wherein in connection with the hydrogen-correlated doping, defects or crystal imperfections are produced in a targeted manner in the treatment region by means of ion irradiation, electron irradiation or by irradiation with laser radiation.

16. The method of claim 1 wherein in connection with the hydrogen-correlated doping, a plurality of doping steps or implantations are carried out with different energies.

17. A method for producing semiconductor elements, the method comprising:
provide a semiconductor material region having a top side region and having a rear side region;
forming at least one integrated semiconductor circuit arrangement in each of a plurality of defined regions of the semiconductor material region;
separating the plurality of defined regions of the semiconductor material region along separating zones located in edge regions of the plurality of defined regions, wherein each of the plurality of separated defined regions provides a semiconductor element;
forming a lateral field stop or a lateral field stop doping for each of the semiconductor elements; and
forming hydrogen-correlated doping in a treatment region of each of the plurality of defined regions, wherein in each of the plurality of defined regions the treatment region (i) lies outside a first zone which contains the at least one integrated semiconductor circuit arrangement but does not contain any of the separating zones, and (ii) lies within a second zone which contains the at least one integrated semiconductor circuit arrangement and also contains the separating zones;
wherein the hydrogen-correlated doping is formed in such a way and the separation of the plurality of defined regions is carried out in such a way that the hydrogen-correlated doping partially or completely remains after the separation of the plurality of defined regions and functions as a lateral field stop or as lateral field stop doping of the resulting semiconductor elements in the edge regions thereof.

18. The method of claim 17 wherein the hydrogen-correlated doping is carried out in the presence of an increased oxygen concentration in a material to be doped.

19. The method of claim 17 wherein in connection with the hydrogen-correlated doping, defects or crystal imperfections are produced in a targeted manner in the treatment region by means of ion irradiation, electron irradiation or by irradiation with laser radiation.

20. A method for producing semiconductor elements, the method comprising:
providing a semiconductor material region having a top side region and having a rear side region;
forming at least one semiconductor circuit arrangement in each of a plurality of defined regions of the semiconductor material region, each of the defined regions including an inner zone containing the semiconductor circuit arrangement, an outer zone including edge regions, and separating zones located in the edge regions;
separating the plurality of defined regions of the semiconductor material region along the separating zones and into semiconductor elements;
forming a lateral field stop or a lateral field stop doping for each of the semiconductor elements; and
effecting hydrogen-correlated doping in at least one treatment region in each of the plurality of defined regions, wherein the at least one treatment region in each defined region (i) lies outside the inner zone, and (ii) lies within the outer zone and also within the separating zones;
wherein the hydrogen-correlated doping is effected in such a way and the plurality of defined regions are separated in such a way that the hydrogen-correlated doping partially or completely remains after the separation of the plurality of defined region and functions as a lateral field stop or as a lateral field stop doping of the semiconductor elements; and
wherein the hydrogen-correlated doping is carried out in the presence of an increased oxygen concentration in a material to be doped.

* * * * *